(12) United States Patent
Koshiishi et al.

(10) Patent No.: US 8,048,327 B2
(45) Date of Patent: Nov. 1, 2011

(54) PLASMA PROCESSING APPARATUS AND CONTROL METHOD THEREOF

(75) Inventors: Akira Koshiishi, Nirasaki (JP); Masatoshi Kitano, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 761 days.

(21) Appl. No.: 12/031,531

(22) Filed: Feb. 14, 2008

(65) Prior Publication Data

US 2008/0135519 A1    Jun. 12, 2008

Related U.S. Application Data

(62) Division of application No. 10/846,643, filed on May 17, 2004, now abandoned.

(30) Foreign Application Priority Data

May 16, 2003    (JP) ................................. 2003-138274

(51) Int. Cl.
G01L 21/30    (2006.01)
C23F 1/00    (2006.01)

(52) U.S. Cl. .............. 216/61; 216/59; 216/67; 438/905; 134/1.1

(58) Field of Classification Search .................... 216/59, 216/61, 67; 438/905; 134/1.1
See application file for complete search history.

(56) References Cited

U.S. PATENT DOCUMENTS

| 5,507,874 A * | 4/1996 | Su et al. ............................ 134/1 |
| 5,746,928 A | 5/1998 | Yen et al. |
| 5,865,896 A | 2/1999 | Nowak et al. |
| 6,010,967 A | 1/2000 | Donohoe et al. |
| 6,099,747 A | 8/2000 | Usami |
| 6,478,924 B1 * | 11/2002 | Shamouilian et al. ... 156/345.48 |

FOREIGN PATENT DOCUMENTS

| JP | 60-213026 | 10/1985 |
| JP | 07-058028 | 3/1995 |
| JP | 2001-230239 | 8/2001 |
| JP | 2002-43235 | 2/2002 |
| JP | 2003-7674 | 1/2003 |

OTHER PUBLICATIONS

Japanese Office Action dated Apr. 20, 2010 and its English translation.
Taiwanese Office Action issued Feb. 21, 2011, in Patent Application No. 093113761 (with English-language translation).
Japanese Office Action mailed on May 10, 2011, with English translation, issued for JP Application No. 2003-138274, filed May 16, 2003.
Office Action issued Aug. 16, 2011 in Japanese Patent Application No. 2003-138274 (with English translation).

* cited by examiner

*Primary Examiner* — Shamim Ahmed
(74) *Attorney, Agent, or Firm* — Oblon, Spivak, McClelland, Maier & Neustadt, L.L.P.

(57) ABSTRACT

In a plasma processing apparatus for processing an object to be processed by generating plasma in a processing chamber: a first electrode is arranged in the processing chamber and a second electrode is arranged to face the first electrode in the processing chamber; a first and a second power systems include a first and a second power supplies for supplying a first and a second powers to the first and the second electrodes, respectively; and a control unit controls both or either one of the first and the second power systems so as to apply a preprocessing voltage to the second electrode for a time period before plasma processing is performed on the object.

10 Claims, 10 Drawing Sheets

UPPER ELECTRODE

LOWER ELECTRODE

UPPER ELECTRODE

LOWER ELECTRODE

| | FREQUENCY OF ABNORMAL DISCHARGE OCCURRENCE | |
|---|---|---|
| | VOLTAGE OF LOWER ELECTRODE WITHOUT OVERSHOOT | VOLTAGE OF LOWER ELECTRODE WITH OVERSHOOT |
| | C1U/C2U=1500/900 STEP L1L/L2L=100/500 STEP | C1U/C2U=1200/600 STEP L1L/L2L=400/550 STEP |
| PROCESSOR A | 1.6% | 0.0% |
| PROCESSOR B | 1.1% | 0.0% |

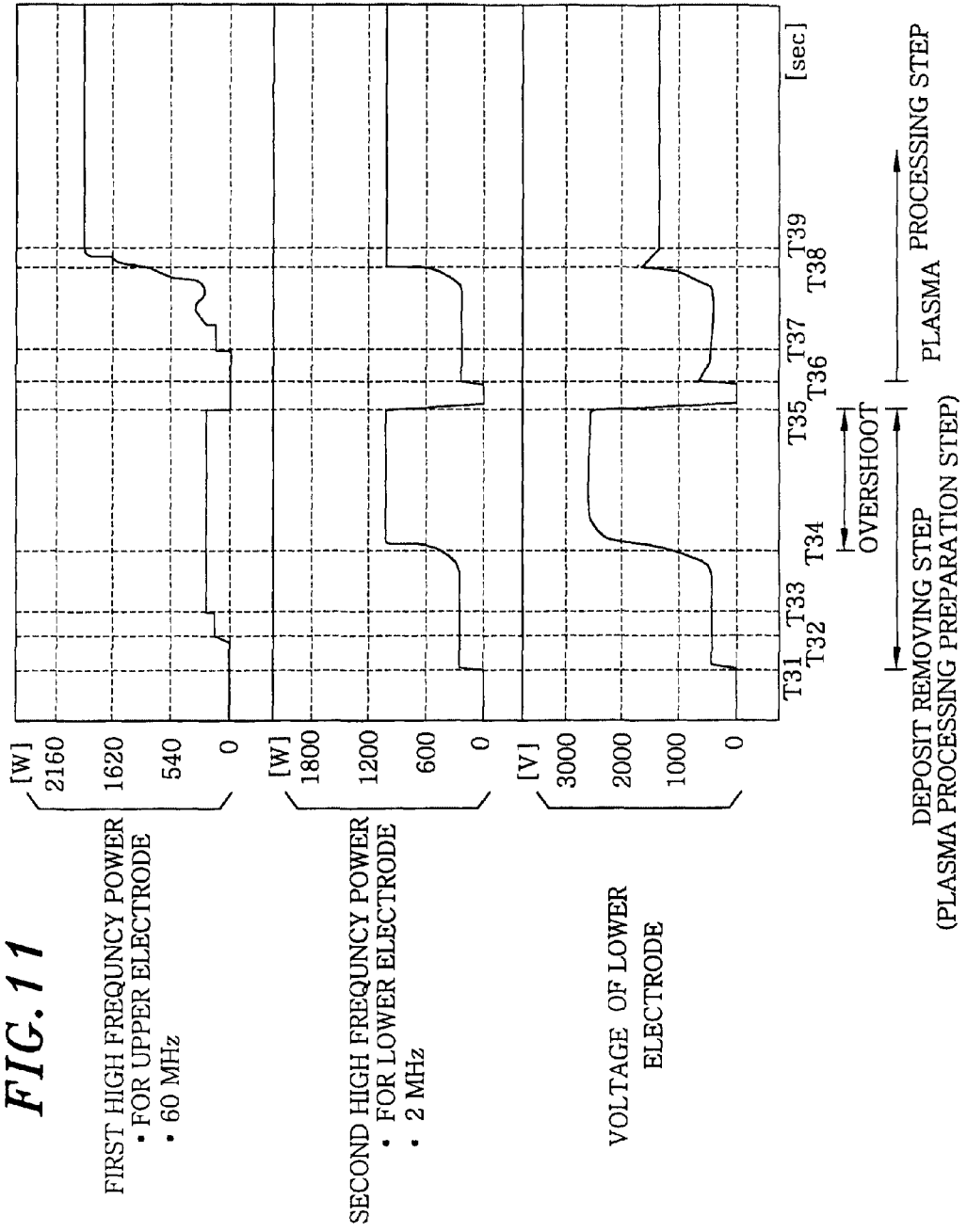

PLASMA PROCESSING APPARATUS AND CONTROL METHOD THEREOF

CROSS-REFERENCE TO RELATED APPLICATIONS

This application is a divisional of U.S. application Ser. No. 10/846,643 filed May 17, 2004, now abandoned, the entire contents of which are incorporated herein by reference, and claims the benefit of priority from the prior Japanese Patent Application No. 2003-138274, filed May 16, 2003.

FIELD OF THE INVENTION

The present invention relates to a plasma processing apparatus for performing a plasma processing such as an etching and the like on an object to be processed, e.g., a semiconductor wafer, and a control method thereof.

BACKGROUND OF THE INVENTION

In a conventional semiconductor manufacturing process, a plasma processing apparatus using a high frequency glow discharge of a reaction gas (a processing gas) introduced into a processing chamber has been widely used in order to perform microprocessing on a surface of an object to be processed, e.g., a semiconductor wafer (hereinafter, referred to as a "wafer"). Among those plasma processing apparatuses, the so-called parallel plate plasma processing apparatus in which electrodes are opposedly arranged to face each other at an upper and a lower portions of the processing chamber is appropriate for processing of a large diameter wafer.

The parallel plate plasma etching processing apparatus 25 has elevatable upper and lower electrodes arranged parallel to each other in a processing chamber. The lower electrode also serves as a mounting table of a wafer. When high frequency powers having different frequencies are respectively applied to the upper electrode and the lower electrode, a glow discharge is generated between the lower electrode on which the wafer is loaded and the upper electrode, so that the reaction gas introduced into the processing chamber becomes plasma. Ions of the plasma collide against a surface of the wafer due to an electric potential difference generated between the electrodes, thereby etching a film, e.g., an insulating film, formed on the wafer surface.

Around the peripheral portions of the lower electrode and the upper electrode, a focus ring surrounding the wafer loaded on top of the lower electrode and a shield ring are arranged, respectively. By using the two rings, the plasma generated between the upper and the lower electrodes is converged on the wafer, and, accordingly, the plasma density above the wafer surface becomes uniform.

During the manufacturing process of a semiconductor, various reaction gases for forming or removing films are introduced into the processing chamber of the plasma processing apparatus. Although it is desirable that the reaction gases react completely as intended, parts of the reaction gases are discharged out of the processing chamber without having any reaction and parts of the reaction gases generate undesirable reaction by-products. Further, such reaction by-products adhere to various portions of the processing chamber. Hereinafter, the undesirable reaction by-products adhered to the processing chamber are referred to as "deposits".

The deposits can be removed by cleaning the processing chamber of the plasma processing apparatus. However, once the plasma processing apparatus starts operation and repeats plasma processing on wafers, new deposits are generated and gradually accumulated in the processing chamber.

Especially, in case the deposits are adhered around the peripheral portions of the upper and the lower electrodes, e.g., on the focus ring and the like, the deposits may cause an abnormal discharge soon after a plasma ignition. Consequently, subsequent film deposition or film removing process may not be appropriately carried out. Further, an emergency stop of the plasma processing apparatus may be required to clean the processing chamber.

As a solution to such problem due to deposits, Japanese Patent Laid-open Publication No. 1995-58028 discloses a substrate mounting table of an ECR-CVD apparatus in which an electrode and its surrounding region are fixed on a base plate.

In the invention disclosed in the Japanese Publication supra, the surrounding region of the electrode is made of aluminum oxide and the like and, further, fixed on the base plate, so that it acquires rigidity, acid resistance and insulating property. Therefore, by repeatedly cleaning the surrounding region of the electrode, it is possible to maintain same in a clean state free of the deposits. Further, a time required to clean the surrounding region of the electrode can be shortened.

However, in the above prior art, even though the cleaning process for removing deposits from the surrounding region of the electrode can be facilitated, the plasma processing apparatus is still required to be stopped for the removal of the deposits. In an up-to-date semiconductor manufacturing process for forming a multilayer structure on a large diameter wafer, deposits tend to grow faster than before. Therefore, if the plasma processing apparatus is stopped frequently to remove the deposits, the throughput thereof can be substantially deteriorated.

SUMMARY OF THE INVENTION

It is, therefore, an object of the present invention to provide a new and improved plasma processing apparatus capable of removing deposits from a processing chamber while maintaining the continuous operation of the processing apparatus and a control method thereof.

In accordance with one aspect of the invention, there is provided a plasma processing apparatus for processing an object to be processed by generating a plasma in a processing chamber, including a first electrode installed in the processing chamber, a second electrode arranged to face the first electrode in the processing chamber, a first power system including a first power supply for supplying a first power to the first electrode, a second power system including a second power supply for supplying a second power to the second electrode, and a control unit for controlling the first and the second power systems, wherein the control unit controls both or either one of the first and the second power systems so as to apply a preprocessing voltage for a time period before plasma processing is performed on the object in the processing chamber, the preprocessing voltage being higher than a voltage applied to the second electrode during the plasma processing of the object.

In accordance with another aspect of the invention, there is provided a control method of a plasma processing apparatus, which includes a first electrode arranged in a processing chamber, a second electrode arranged to face the first electrode in the processing chamber, a first power supply for supplying a first power to the first electrode and a second power supply for supplying a second power to the second electrode, wherein a preprocessing voltage is applied to the second electrode for a time period before plasma processing is performed on an object to be processed in the processing chamber, the preprocessing voltage being higher than a voltage applied to the second electrode during the plasma processing of the object.

By applying the preprocessing voltage of an appropriate level to the second electrode, it is possible to remove the deposits accumulated inside the processing chamber, especially, around the peripheral portion of the second electrode. If the preprocessing voltage to the second electrode is set to be applied before the beginning of the plasma processing performed on an object to be processed, the plasma processing can be performed on the object in the processing chamber which is free of deposits.

The preprocessing voltage applied to the second electrode can be easily generated by adjusting reactances of both or either one of a first matching unit and a second matching unit, the first matching unit matching impedances of a first power supply side and a first electrode side and the second matching unit matching impedances of a second power supply side and a second electrode side. Further, the preprocessing voltage applied to the second electrode can be generated by adjusting power levels and output timings of the first and the second powers respectively outputted from the first and the second power supplies.

In accordance with still another aspect of the invention, there is provided a control method of a plasma processing apparatus, which has a first electrode arranged in a processing chamber, a second electrode arranged to face the first electrode in the processing chamber, a first power supply for supplying a first power to the first electrode and a second power supply for supplying a second power to the second electrode, the control method including the steps of: performing a plasma processing process on an object to be processed under a first plasma forming condition by generating a plasma in the processing chamber by applying respective high frequency powers to the electrodes; and performing, prior to the above step, a plasma processing preparation process for generating a plasma for a time period under a second plasma forming condition, which is different from the first plasma forming condition.

In such a control method, it is possible to sputter and remove deposits accumulated inside the processing chamber, especially, around the peripheral portion of the second electrode by using a plasma generated during the plasma processing preparation step. Since the plasma processing preparation step is performed before the plasma processing step at which a predetermined plasma processing is performed on an object to be processed, it is possible to perform the plasma processing on the object in the processing chamber which is free of deposits.

A preprocessing voltage applied to the second electrode during the plasma processing preparation process is higher than a voltage applied to the second electrode during the plasma processing process. Using the preprocessing voltage, deposits can be removed from the peripheral portion of the second electrode.

BRIEF DESCRIPTION OF THE DRAWINGS

The above and other objects and features of the present invention will become apparent from the following description of preferred embodiments, given in conjunction with the accompanying drawings, in which:

FIG. 11 displays a waveform chart showing a first high frequency power, a second high frequency power and a voltage of a lower electrode in the plasma processing apparatus in accordance with the second preferred embodiment.

DETAILED DESCRIPTION OF THE PREFERRED EMBODIMENTS

Figure 1:
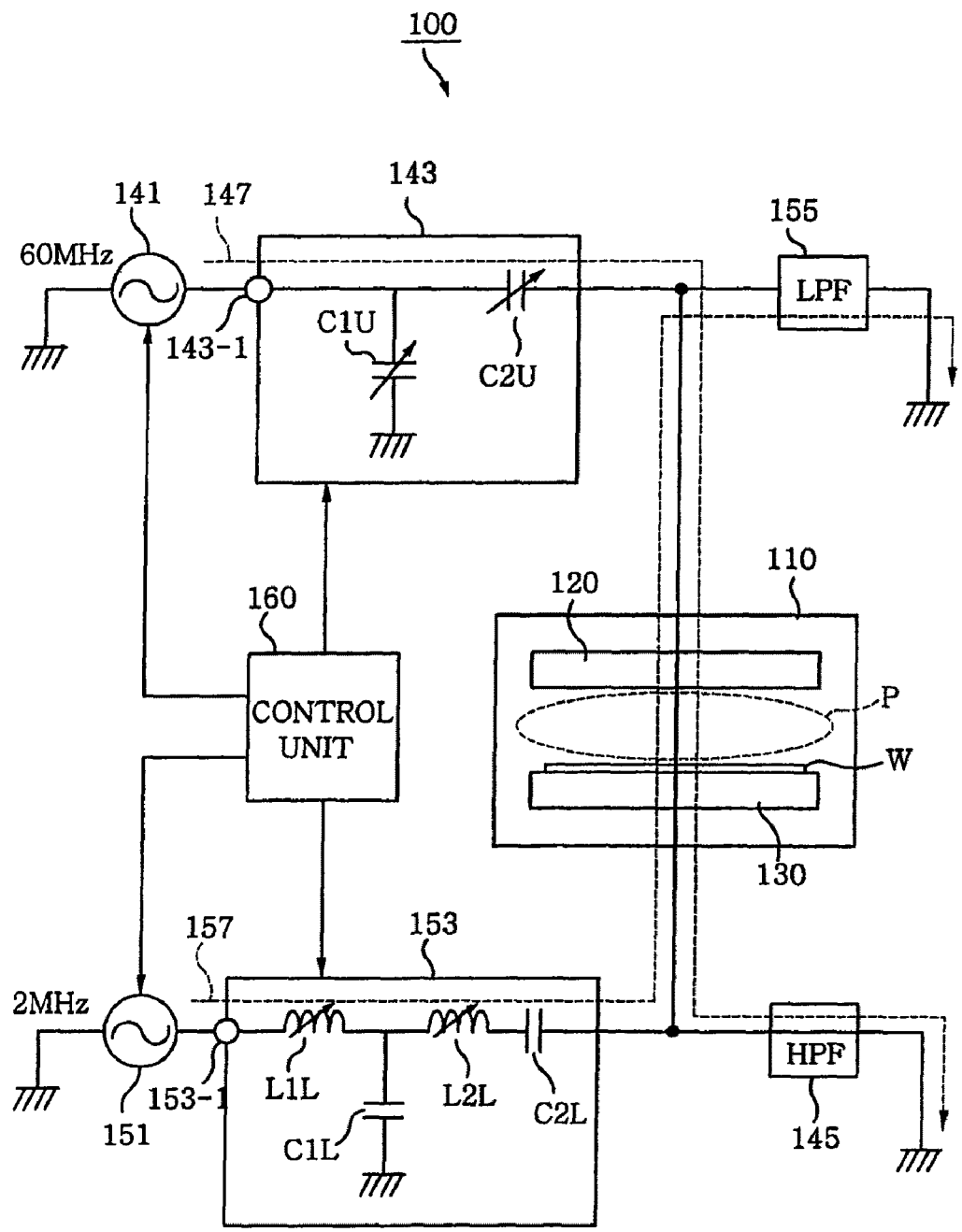
FIG. 1 shows a block diagram for illustrating a configuration of a plasma processing apparatus in accordance with a first preferred embodiment of the present invention.

Hereinafter, preferred embodiments of a plasma processing apparatus and a control method thereof in accordance with the present invention will be described in detail with reference to accompanying drawings. Further, like reference numerals will be given to like parts having substantially the same functions, and redundant description thereof will be omitted in the specification and the accompanying drawings.

First Preferred Embodiment

FIG. 1 shows a configuration of a plasma processing apparatus 100 in accordance with a first preferred embodiment of the present invention. The plasma processing apparatus 100 has a processing vessel (not shown) made of a conductive material, e.g., aluminum. The processing vessel has therein a processing chamber 110 where a predetermined plasma processing is performed on an object to be processed, i.e., a wafer W.

An upper electrode (a first electrode) 120 and a susceptor 130 are arranged to face each other in the processing chamber 110. The approximately cylindrical susceptor 130 provided at a lower portion of the processing chamber 110 functions as a mounting table on which the wafer W is loaded during the plasma processing and, at the same time, as a lower electrode (a second electrode) for generating a glow discharge together with the upper electrode 120 installed at an upper portion of the processing chamber 110, so that a reaction gas introduced into the processing chamber 110 becomes plasma. The plasma P generated between the upper electrode 120 and the susceptor 130 performs a predetermined plasma processing such as an etching or the like on the wafer W.

The upper electrode 120 is arranged apart from the susceptor 130 having therebetween a distance of in a range, e.g., from 5 mm to 150 mm. Further, the upper electrode 120 and the susceptor 130 can vertically move independently. The distance therebetween is adjusted based on the type of the plasma processing and, further, controlled so as to obtain a uniformity of the plasma.

Hereinafter, a high frequency power system of the plasma processing apparatus 100 will be described. The plasma processing apparatus 100 has two power systems, i.e., a first power system for supplying a first high frequency power 147 to the upper electrode 120 and a second power system for supplying a second high frequency power 157 to the susceptor 130.

The first power system includes a first high frequency power supply 141 for outputting the first high frequency power 147 of, e.g., 60 MHz, a first matching unit 143 for matching impedances of a load side and a first high frequency power supply 141 side, and a high pass filter (HPF) 145 coupled to the susceptor 130. The first matching unit 143 includes variable capacitors C1U and C2U of which capacitances can be varied. The variable capacitor C1U is connected between a transmission line of the first high frequency power 147 and the ground, and the variable capacitor C2U is connected to the transmission line of the first high frequency power 147 in series.

Meanwhile, the second power system includes a second high frequency power supply 151 for outputting the second high frequency power 157 of, e.g., 2 MHz, a second matching unit 153 for matching impedances of a load side and a second high frequency power supply 151 side, and a low pass filter (LPF) 155 coupled to the upper electrode 120. The second matching unit 153 includes variable inductors L1L and L2L of which inductances can be varied and capacitors C1L and C2L having constant capacitances. The variable inductors L1L and L2L and the capacitor C2L are connected to the transmission line of the second high frequency power 157 in series in that order from the second high frequency power supply 151. Further, the capacitor C1L is connected between the ground and a connecting line between the variable inductors L1L and L2L.

The first high frequency power 147 outputted from the first high frequency power supply 141 is supplied to the upper electrode 120 via the first matching unit 143, and the second high frequency power 157 outputted from the second high frequency power 151 is supplied to the susceptor 130 via the second matching unit 153 to thereby convert a reaction gas introduced into the processing chamber 110 into a plasma.

If a plasma P is generated between the upper electrode 120 and the susceptor 130, the first high frequency power 147 flows from the upper electrode 120 to the susceptor 130, while the second high frequency power 157 flows from the susceptor 130 to the upper electrode 120. The high frequency power 147 passing through the susceptor 130 is grounded via the HPF 145, while the second high frequency power 157 passing through the upper electrode 120 is grounded via the LPF 155.

Since the HPF 145 is connected to the susceptor 130, the first high frequency power 147 is prevented from flowing toward the second matching unit 153 and the second high frequency power supply 151 which are included in the second power system, thereby stabilizing an operation of the second power system. In the same manner, since the LPF 155 is connected to the upper electrode 120, the second high frequency power 157 is prevented from flowing toward the first matching unit 143 and the first high frequency power supply 141 which are included in the first power system, thereby stabilizing an operation of the first power system.

Further, inner circuits of the first matching unit 143 and the second matching unit 153 shown in FIG. 1 are examples and, therefore, it is desirable to modify a connection between capacitors and inductors and the number thereof depending on a configuration of the plasma processing apparatus 100 (especially, a configuration of the high frequency power system) or processing conditions.

The plasma processing apparatus 100 has a control unit 160 for controlling the first and the second power systems. The control unit 160 controls the first and the second high frequency power supplies 141 and 151 and the first and the second matching units 143 and 153, at least as described below. In the following, specific examples of the control performed by the control unit 160 will be described.

The control unit 160 adjusts an output frequency, an output timing and a power level of the first high frequency power 147 outputted from the first high frequency power supply 141 to the upper electrode 120.

In case an impedance of the first high frequency power supply 141 side is, e.g., 50Ω, the control unit 160 adjusts respective capacitances of the variable capacitors C1U and C2U included in the first matching unit 143 so that an impedance of a load side seen from an input terminal 143-1 of the first matching unit 143 can be 50Ω.

Moreover, the control unit 160 adjusts an output frequency, an output timing and a power level of the second high frequency power 157 outputted from the second high frequency power supply 151 to the susceptor 130.

In case an impedance of the second high frequency power supply 151 side is, e.g., 50Ω, the control unit 160 adjusts respective inductances of the variable inductors L1L and L2L included in the second matching unit 153 so that an impedance of a load side seen from an input terminal 153-1 of the second matching unit 153 can be 50Ω.

Although it is not illustrated in FIG. 1, a first detector can be provided between the first matching unit 143 and the upper electrode 120 to detect information on the first high frequency power 147 supplied to the upper electrode 120 [e.g., a frequency and a power level of the first high frequency power 147 and an actual timing when the first high frequency power 147 is applied to the upper electrode 120]. And the information detected by the first detector may be fed back to the control unit 160. In this manner, the control unit 160 can control the operation of the first high frequency power supply 141 and that of the first matching unit 143 with highly enhanced accuracy. Further, by providing a second detector between the second matching unit 153 and the susceptor 130, the same effects can be obtained in controlling the second high frequency power supply 151 and the second matching unit 153.

Figure 2:
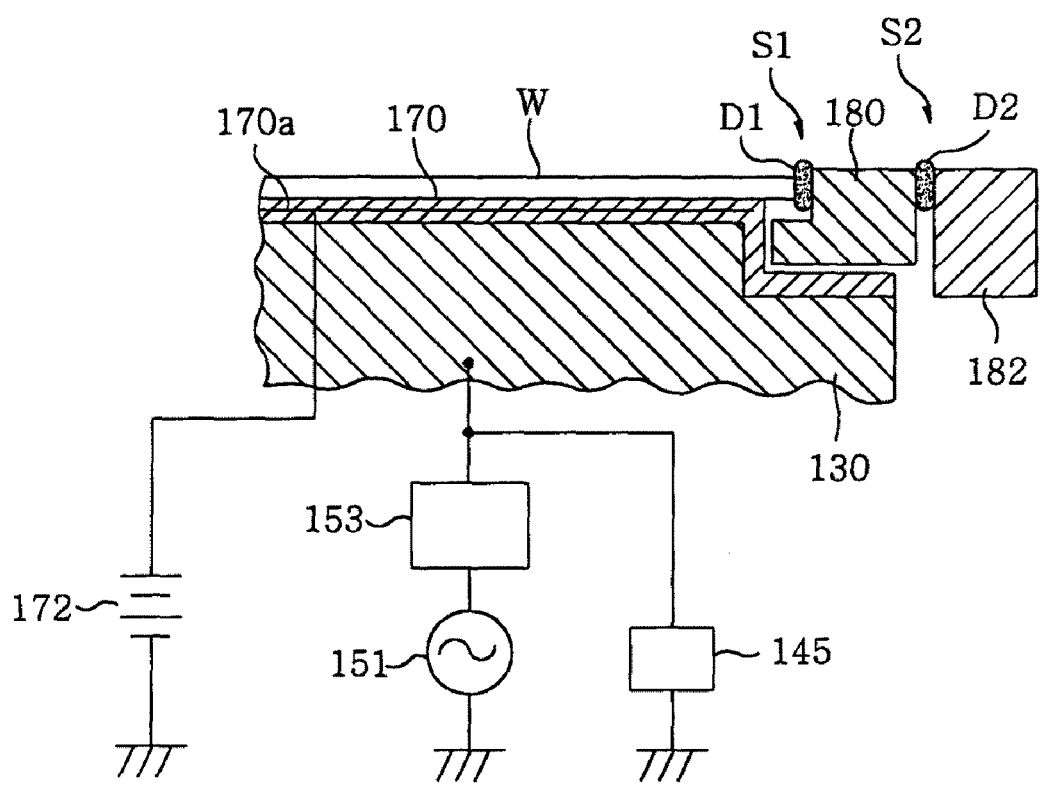
FIG. 2 illustrates a cross sectional view of a susceptor of the plasma processing apparatus and a surrounding region thereof in accordance with the first preferred embodiment.

Hereinafter, the susceptor 130 serving as a lower electrode (a second electrode) installed in the processing chamber 110 and a surrounding region thereof will be described in detail with reference to FIG. 2.

As described above, the susceptor 130 serving as the lower electrode (the second electrode) is connected to the second high frequency power supply 151 via the second matching unit 153.

An electrostatic chuck 170 is provided on top of the susceptor 130. A DC power supply 172 is connected to an electrode plate 170a of the electrostatic chuck 170. By applying a high voltage from the DC power supply 172 to the electrode plate 170a at a high vacuum, a wafer W can be electrostatically attracted and held on the electrostatic chuck 170.

Around the peripheral portions of the susceptor 130, a focus ring 180 surrounding the wafer W mounted on top of the electrostatic chuck 170 is arranged. The focus ring 180 is a conductor and is surrounded by a cover ring 182 that is an insulator.

Hereinafter, a general plasma processing will be described. A wafer W as an object of the plasma processing is conveyed into the processing chamber 110 illustrated in FIGS. 1 and 2 by a transfer mechanism (not shown). Then, the wafer W is loaded on the electrostatic chuck 170 provided on the susceptor 130, the electrostatic chuck 170 being lowered to a waiting location. If a DC voltage is applied from a high voltage DC power supply 172 to the electrostatic chuck 170, the wafer W is kept being attracted and held on the electrostatic chuck 170.

The susceptor 130 is elevated to a location where a distance between the susceptor 130 and the upper electrode 120 ranges from 15 to 45 mm. Next, an inner pressure of the processing chamber 110 is adjusted to a level ranging from 15 to 800 mTorr. When the inner space of the processing chamber 110 reaches a predetermined pressure, a reaction gas is introduced into the processing chamber 110.

Then, responsive to a control signal from the control unit 160, the first high frequency power supply 141 outputs the first high frequency power 147 and the second high frequency power supply 151 outputs the second high frequency power 157. When the first and the second high frequency power 147 and 157 are applied to the upper electrode 120 and the susceptor 130, respectively, a glow discharge is generated between the upper electrode 120 and the susceptor 130, thereby igniting the plasma P. When the ignited plasma P is stabilized, a predetermined plasma processing such as an etching or the like is performed on the wafer W.

When the plasma processing using the plasma processing apparatus 100 is started, the focus ring 180 makes the plasma converge on the wafer W. Without the focus ring 180, the plasma is diffused toward an inner wall of the processing chamber 110, thereby decreasing a plasma density at each peripheral portion of the upper electrode 120 and the susceptor 130. By way of using the focus ring 180, it is possible to obtain a uniform plasma density throughout a central portion and a peripheral portion of the wafer W. As a result, an abnormal discharge around the peripheral portion of the wafer W caused by nonuniformity of the plasma is prevented.

However, as described above, in case deposits D1 exist around a peripheral portion of the susceptor 130, e.g., a region S1 between the focus ring 180 and the wafer W which is near to a portion where the plasma is generated, an abnormal discharge may occur between the upper electrode 120 and the deposits D1 right after the plasma ignition. Further, in case deposits D2 are accumulated at a region S2 which is between a conductor, i.e., the focus ring 180, and an insulator, i.e., the cover ring 182, the abnormal discharge may occur between the deposits D2 and the upper electrode 120 and, further, the plasma density above the wafer W may become nonuniform. Such phenomenon leads to deterioration of quality of the wafer W after plasma processing and causes a system breakdown, resulting in deterioration of throughput.

To that end, the plasma processing apparatus 100 in accordance with the first preferred embodiment removes deposits from the processing chamber 110, especially, from the surrounding regions [e.g., regions S1 and S2] of the susceptor 130 serving as a lower electrode (a second electrode).

Hereinafter, a configuration of the plasma processing apparatus 100 having a function of removing deposits and a control method thereof will be illustrated in comparison with a typical plasma processing apparatus and a control method thereof.

In the plasma processing apparatus 100 and the control method thereof in accordance with the first preferred embodiment, an overshoot voltage, i.e., a preprocessing voltage, is applied to the susceptor 130 right before a predetermined plasma processing such as an etching or the like is performed on the wafer W, that is, at the time of plasma ignition, in order to remove deposits accumulated inside the processing chamber 110, especially, around the peripheral portion of the susceptor 130 serving as the lower electrode.

Figure 3:
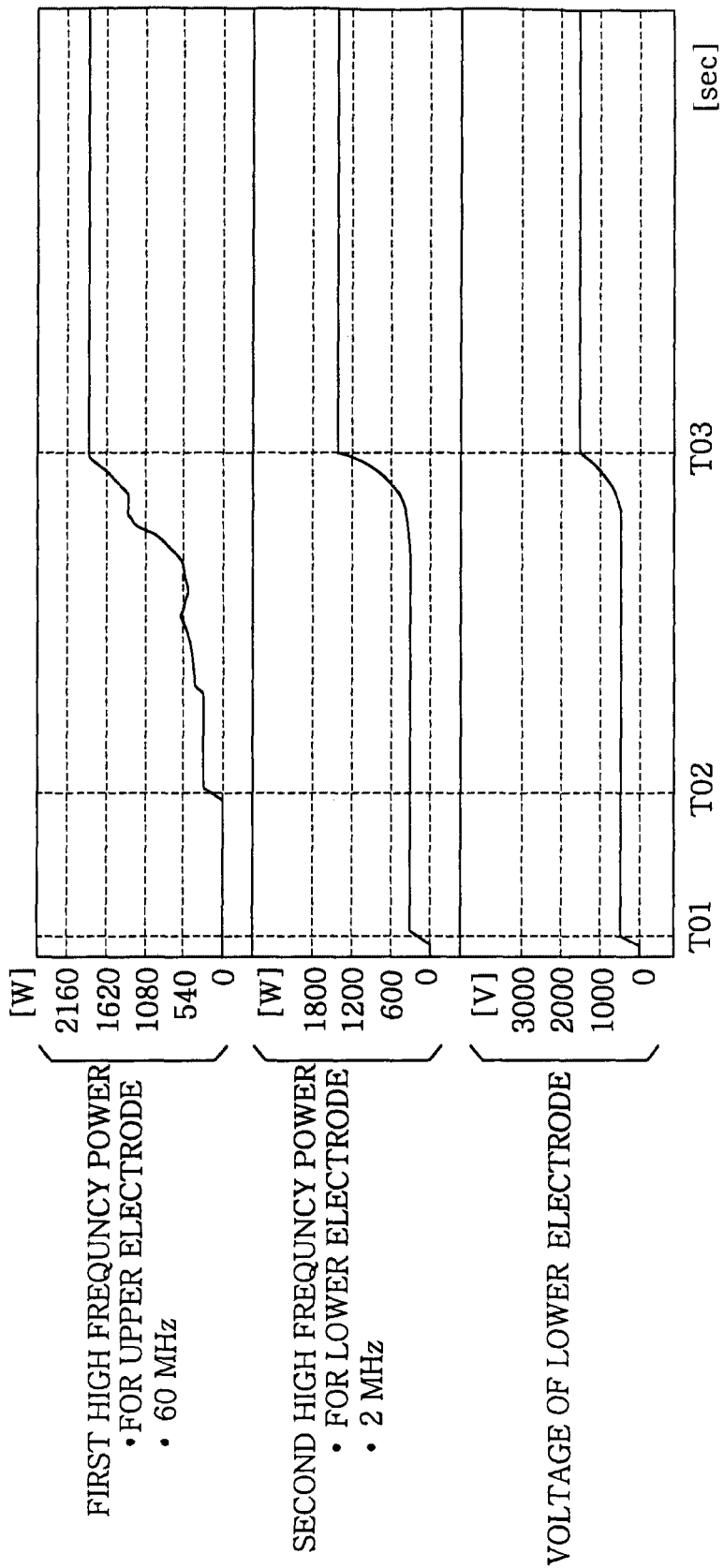
FIG. 3 sets forth a waveform chart showing a first high frequency power, a second high frequency power and a voltage of a lower electrode in a typical plasma processing apparatus.

First of all, an operation of a typical plasma processing apparatus during a period from a plasma ignition to a beginning of the actual plasma processing will be described, wherein an overshoot voltage is not applied to the susceptor 130, i.e., the lower electrode. FIG. 3 illustrates an operation of such a typical plasma processing apparatus by showing power waveforms of a first and a second high frequency power respectively applied to the upper and the lower electrode and a voltage waveform of the lower electrode during the period from the plasma ignition to the beginning of the actual plasma processing.

As shown in FIG. 3, at a time T01, the second high frequency power adjusted to an initial level (e.g., 200 to 1000 W) is outputted from the second high frequency power supply and then applied to the lower electrode. Next, at a time T02, the first high frequency power adjusted to an initial level (e.g., 50 to 1000 W) is outputted from the first high frequency power supply and then applied to the upper electrode.

Although the plasma is ignited between the upper electrode and the lower electrode at the time T02, since the second high frequency power adjusted to the initial level is previously applied to the lower electrode at the time T01, a coating region referred to as an ion sheath is already formed on a surface of the wafer loaded on the lower electrode. A plasma density is not uniform right after the plasma ignition and, thus, when the plasma in such a state is in contact with the wafer, a current caused by a spatial variation of the plasma density flows along the wafer. The current may damage components, e.g., semiconductor devices and the like, formed on the wafer. However, if the ion sheath is formed on the wafer surface by the time of plasma ignition, the plasma does not contact the wafer and, therefore, the components of the wafer are maintained in a desirable state.

Since the time T02, levels of the first and the second high frequency power are controlled so as to obtain a desirable degree of dissociation of a reaction gas which is required for a predetermined plasma processing performed on the wafer. Hereinafter, the level of each high frequency power and a voltage level of the lower electrode are referred to as "recipe level" s. For example, in a recipe for etching a predetermined application, recipe levels of the first and the second high frequency power and the voltage of the lower electrode may be from 1000 to 2500 W, from 1000 to 2000 W, and about 1500 V, respectively.

At a time T03, each of the first and the second high frequency power reaches its own recipe level and the voltage of the lower electrode is controlled to meet the recipe level. Then, while the voltage of the lower electrode is maintained at the recipe level, a predetermined plasma processing is performed on the wafer. Although FIG. 3 illustrates power·voltage waveforms in which the first and the second high frequency power reach the recipe levels at the time T03 almost simultaneously, it is only an example. With a view to protecting the wafer, if the ion sheath is formed on the wafer surface at the time T02, either the first high frequency power or the second high frequency power may reach the recipe level earlier than the other one.

In case a predetermined plasma processing is performed in the plasma processing apparatus operated during the period from the plasma ignition to the beginning of the plasma processing, deposits are accumulated inside the processing chamber 110, especially, around the peripheral portion of the susceptor 130 which also serves as the lower electrode. Consequently, an abnormal discharge occurs due to the deposits, so that a following plasma processing may not be appropriately performed. Further, in order to start a predetermined plasma processing, an urgent stop of the entire plasma processing apparatus may be required to clean the processing chamber.

Figure 4:
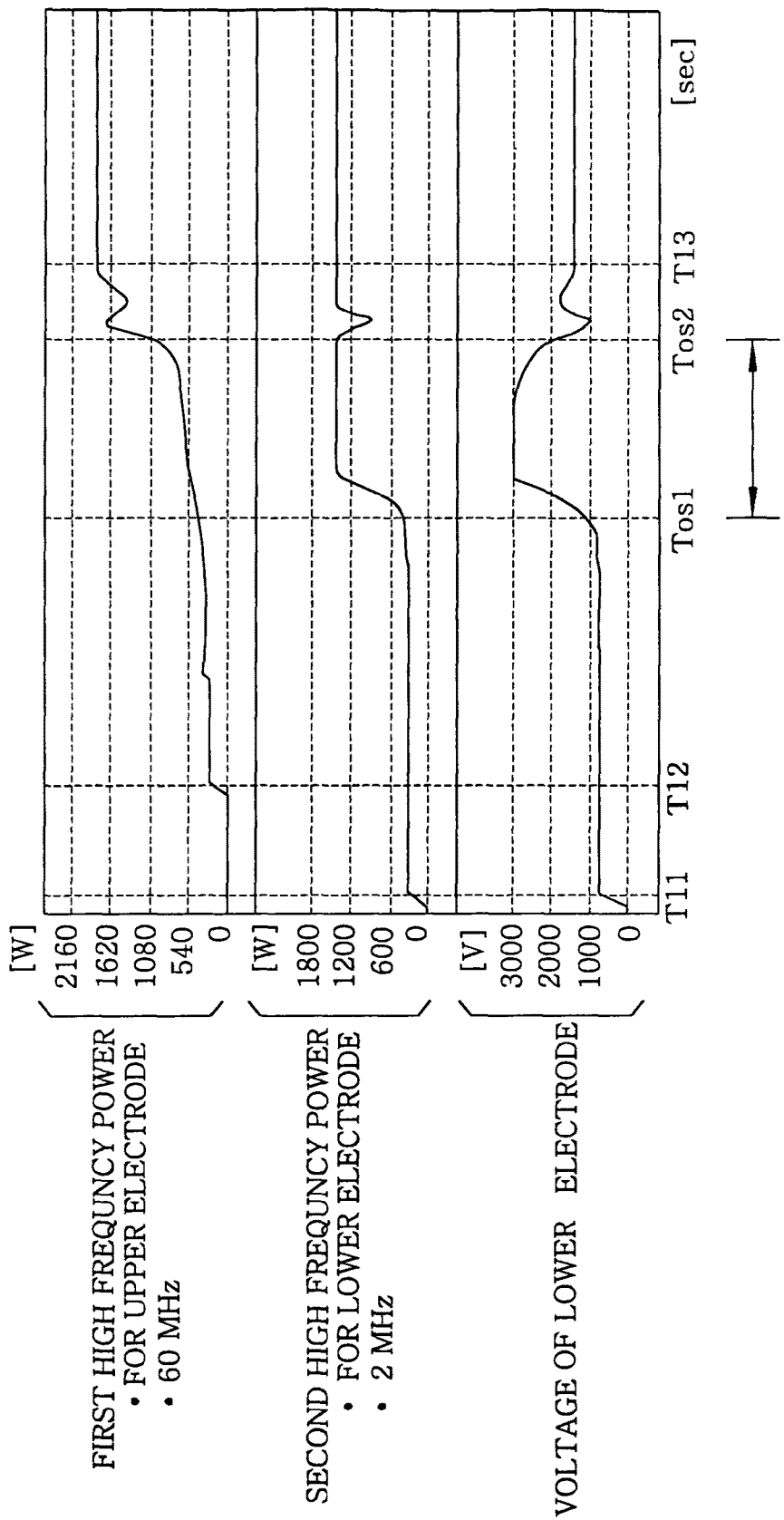
FIG. 4 gives a waveform chart showing a first high frequency power, a second high frequency power and a voltage of a lower electrode in the plasma processing apparatus in accordance with the first preferred embodiment of the present invention.

Hereinafter, the plasma processing apparatus in accordance with the first preferred embodiment which is capable of solving the above-described problem and a control method thereof will be described. FIG. 4 illustrates an operation of the plasma processing apparatus 100 by showing a power waveform of the first high frequency power 147 applied to the upper electrode 120, a power waveform of the second high frequency power 157 applied to the susceptor 130 serving as the lower electrode and a voltage waveform of the susceptor 130 during the period from the plasma ignition to the beginning of the actual plasma processing.

As shown in FIG. 4, at a time T11, the second high frequency power 157 modulated to the initial level (e.g., 200 to 1000 W) is outputted from the second high frequency power supply 151 and then applied to the susceptor 130. Then, at a time T12, the first high frequency power 147 modulated to the initial level (e.g., 50 to 1000 W) is outputted from the first high frequency power supply 141 and then applied to the upper electrode 120. As described above, since the ion sheath is formed on a surface of the wafer W at the time T12, the plasma P whose density is irregular right after the ignition is not in contact with the wafer W. Accordingly, the wafer W and the components formed on the wafer W such as various semiconductor devices and the like are maintained in a desirable state.

Next, the second high frequency power 157 is modulated to a recipe level (e.g., 1000 to 2000 W) at a time Tos1. At this time, a voltage of the susceptor 130, i.e., the lower electrode, starts to increase from a voltage level of the times T11 and T12 so as to reach a voltage level (a peak level, e.g., 3000 V) higher than the recipe level (e.g., 1500 V). Thereafter, the voltage of the susceptor 130 is maintained at a level higher than the recipe level until a time Tos2. A voltage state of the susceptor 130 from the time Tos1 to the time Tos2 is shown in FIG. 4 as an overshoot waveform (an overshoot voltage).

At a time T13, the first high frequency power 147 reaches the recipe level. Further, the voltage of the susceptor 130 decreases from the peak level (deviates from an overshoot state) and is stabilized at the recipe level. Thereafter, the voltage of the susceptor 130 is maintained at the recipe level, thereby enabling to perform a predetermined plasma processing on the wafer W.

As can be seen clearly from a comparison of FIG. 3 with FIG. 4, in the plasma processing apparatus 100 in accordance with the first embodiment and the control method thereof, unlike in the typical plasma processing apparatus and a control method thereof, at a plasma ignition step, a voltage of the susceptor 130 is overshot for a predetermined period of time (time Tos1~time Tos2) right before the voltage of the susceptor 130 is modulated to the recipe level. The plasma processing apparatus 100 in accordance with the first preferred embodiment includes the control unit 160 capable of controlling the voltage of the susceptor 130 to be overshot. Moreover, in the plasma processing apparatus 100 in accordance with the first embodiment, the overshoot voltage is applied to the susceptor 130 for a predetermined period of time right before beginning of a predetermined plasma processing.

In the first preferred embodiment, a reactance of each reactance element [variable capacitors (C1U and C2U) and variable inductors (L1L and L2L)] is adjusted to be a predetermined value by the control unit 160. Accordingly, as illustrated in FIG. 4, it is possible to overshoot the voltage of the susceptor 130 right before it is modulated to the recipe level. A relationship between the reactance control of the first and the second matching units 143 and 153 and the overshoot phenomenon of the voltage of the susceptor 130 has been examined by an experiment performed by using the plasma processing apparatus 100.

For the purpose of comparison, a condition for each reactance of the first and the second matching units 143 and 153 in case a voltage applied to the susceptor 130 does not have an overshoot will be described. A voltage waveform of the susceptor 130 illustrated in FIG. 3, which has no overshoot portion, is obtained by setting a control step for each reactance of the first and the second matching units 143 and 153 in the plasma processing apparatus 100 in accordance with the first embodiment under conditions to be described hereinafter. Further, a reactance (a capacitance) of the first matching unit 143 is adjustable within a range of 0 to 2000 steps and that of the second matching unit 153 is adjustable within a range of 0 to 1000 steps.

[condition 1] C1U=1500 steps; C2U=900 steps; L1L=100 steps; L2L=500 steps

For instance, each capacitance of the variable capacitors C1U and C2U included in the first matching unit 143 is adjusted from 0 to 200 pF by adjusting the capacitors between 0 and 2000 steps. Further, each inductance of the variable inductors L1L and L2L included in the second matching unit 153 is adjusted from 0 to 30 µH by adjusting the inductors between 0 and 1000 steps. The number of steps and each capacitance/inductance are linearly related. Therefore, in case the variable capacitor C1U is adjusted to 1500 steps, the capacitance thereof becomes 150 µF. In case the variable capacitor C2U is adjusted to 900 steps, the capacitance thereof becomes 90 µF. Further, in case the variable inductor L1L is adjusted to 100 steps, the inductance thereof becomes 3 µH, and in case the variable inductor L2L is adjusted to 500 steps, the inductance thereof becomes 15 µH.

A voltage waveform of the susceptor 130 illustrated in FIG. 4, which has an overshoot portion, can be obtained by setting the control step of each reactance of the first and the second matching units 143 and 153 in the plasma processing apparatus 100 in accordance with the first embodiment at following conditions;

[condition 2] C1U=1200 steps; C2U=600 steps; L1L=400 steps; L2L=550 steps

Figure 5A:
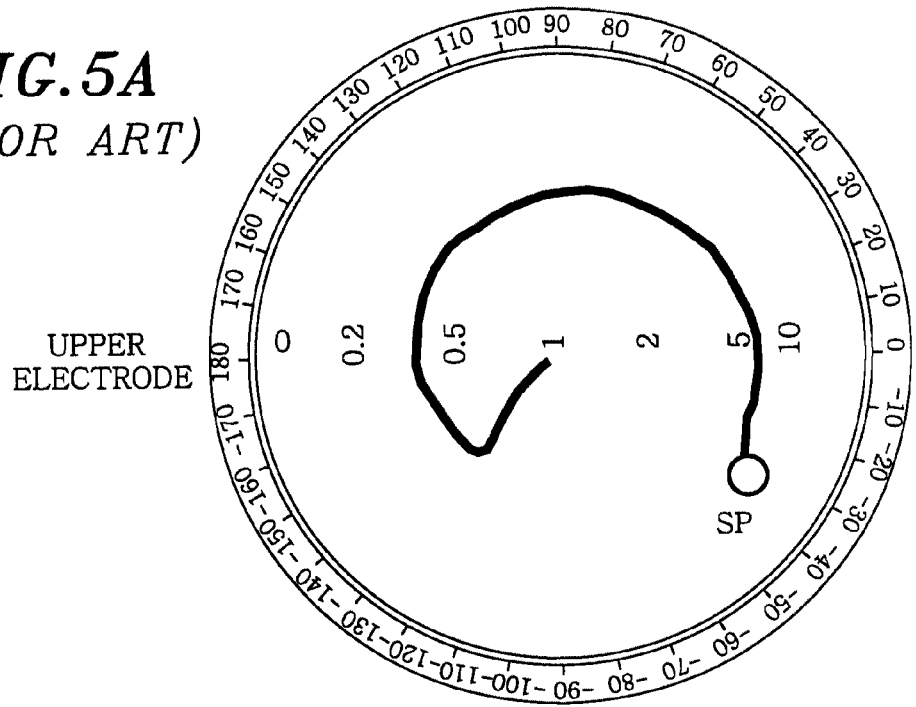
FIG. 5A provides a Smith chart illustrating a locus of an impedance matching of an upper electrode in a typical plasma processing apparatus.
Figure 5B:
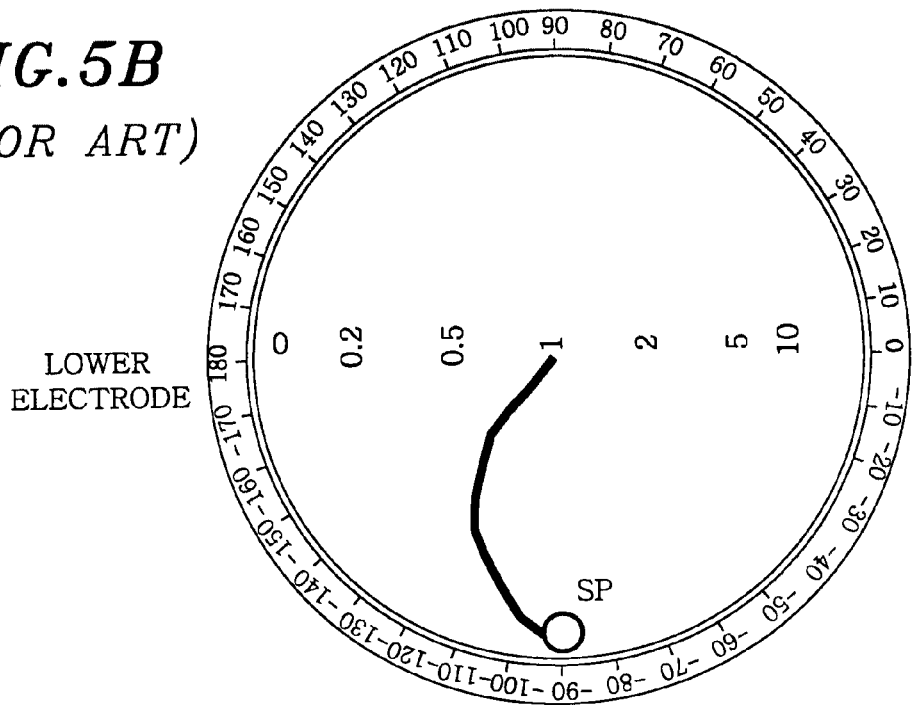
FIG. 5B produces a Smith chart illustrating a locus of an impedance matching of a lower electrode in a typical plasma processing apparatus.

FIGS. 5A and 5B represent Smith charts respectively indicating a locus of an impedance matching of the impedance of the upper electrode 120 side which is seen from the first high frequency power supply 141 side of the first matching unit 143 with that of the susceptor 130 side which is seen from the second high frequency power supply 151 side of the second matching unit 153 when a plasma P is formed between the upper electrode 120 and the susceptor 130 in the plasma processing apparatus 100 to which the aforementioned [condition 1] is applied. In this case, as illustrated in FIG. 3, the voltage of the susceptor 130 is not overshot.

Figure 6A:
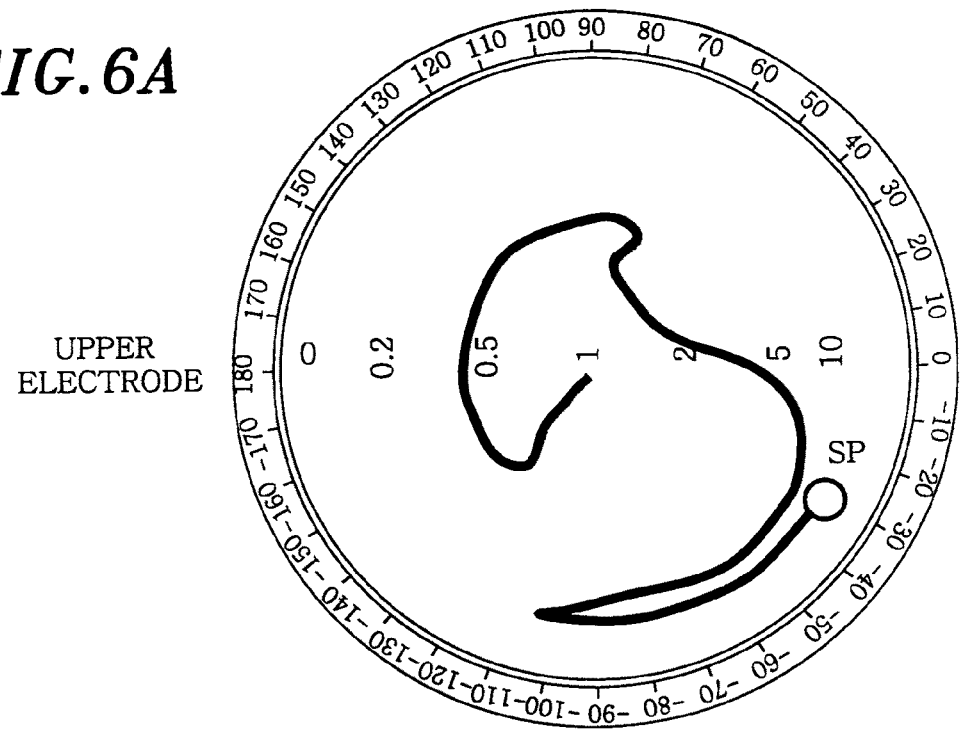
FIG. 6A presents a Smith chart showing a locus of an impedance matching of an upper electrode in the plasma processing apparatus in accordance with the first preferred embodiment of the present invention.
Figure 6B:
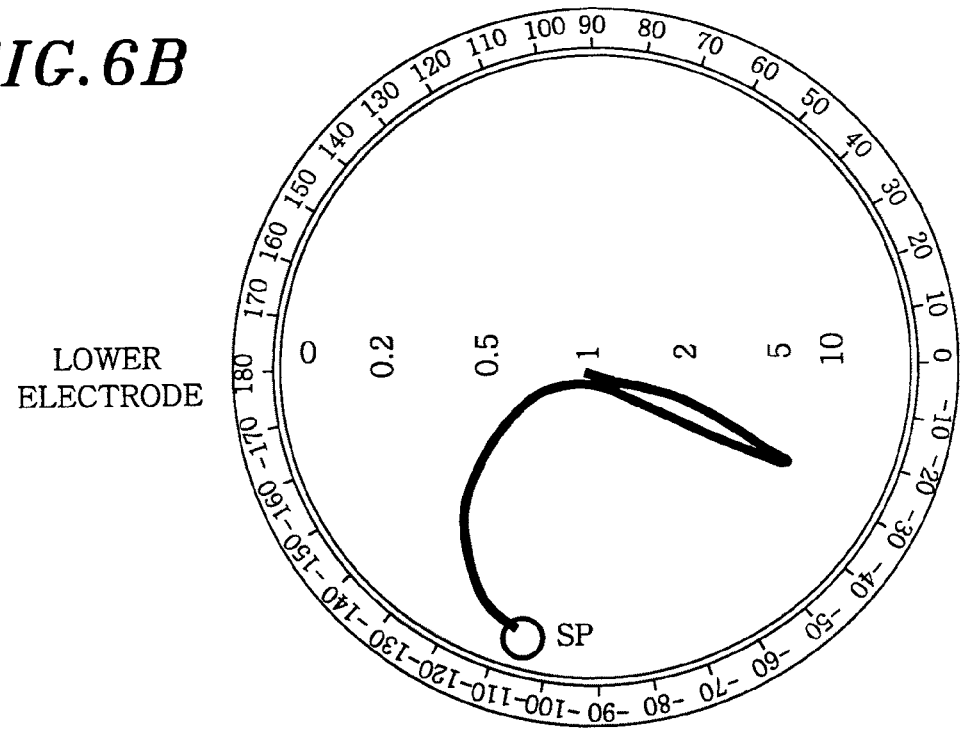
FIG. 6B exhibits a Smith chart showing a locus of an impedance matching of a lower electrode in the plasma processing apparatus in accordance with the first preferred embodiment of the present invention.

FIGS. 6A and 6B represent Smith charts respectively indicating a locus of an impedance matching of the impedance of the upper electrode 120 side which is seen from the first high frequency power supply 141 side of the first matching unit 143 with that of the susceptor 130 side which is seen from the second high frequency power supply 151 side of the second matching unit 153 when a plasma P is formed between the upper electrode 120 and the susceptor 130 in the plasma processing apparatus 100 to which the aforementioned [condition 2] is applied. In this case, as illustrated in FIG. 4, the voltage of the susceptor 130 is overshot.

The impedance locus shown in FIG. 5A is different from that illustrated in FIG. 6A. Further, the impedance locus depicted in FIG. 5B is different from that described in FIG. 6B. This is because each capacitance of the variable capacitors C1U and C2U included in the first matching unit 143 and each inductance of the variable inductors L1L and L2L included in the second matching unit 153 are changed. Besides, as can be seen from FIGS. 5A and 6A, start points SP are different, and a locus to reach the impedance matching which is shown in FIG. 6A is longer than that shown in FIG. 5A. And it is same in FIGS. 5B and 6B. However, an elongation of the locus of impedance matching for the upper electrode 120 side (the relationship between FIGS. 5A and 6A) is greater than that of the susceptor 130 side (the relationship between FIGS. 5B and 6B).

As can be seen from the relationship between FIGS. 5A, B and 6A, B and the relationship between FIGS. 3 and 4, each reactance of the first and the second matching units 143 and 153 is adjusted so that a time to complete the impedance matching of the impedance of the upper electrode 120 side (the impedance matching time of the upper electrode side) with that of the susceptor 130 side (the impedance matching time of the lower electrode side) can be increased and, further, the impedance matching time of the upper electrode side can be prolonged than that of the lower electrode side. Thus, it is possible to overshoot the voltage of the susceptor 130, i.e., the lower electrode, for a predetermined period of time right before it is modulated to the recipe level. In the first preferred embodiment, each reactance of the first and the second matching units 143 and 153 is adjusted by the control unit 160 in order to give an overshoot to the voltage applied to the susceptor 130.

Figures 7, 8:
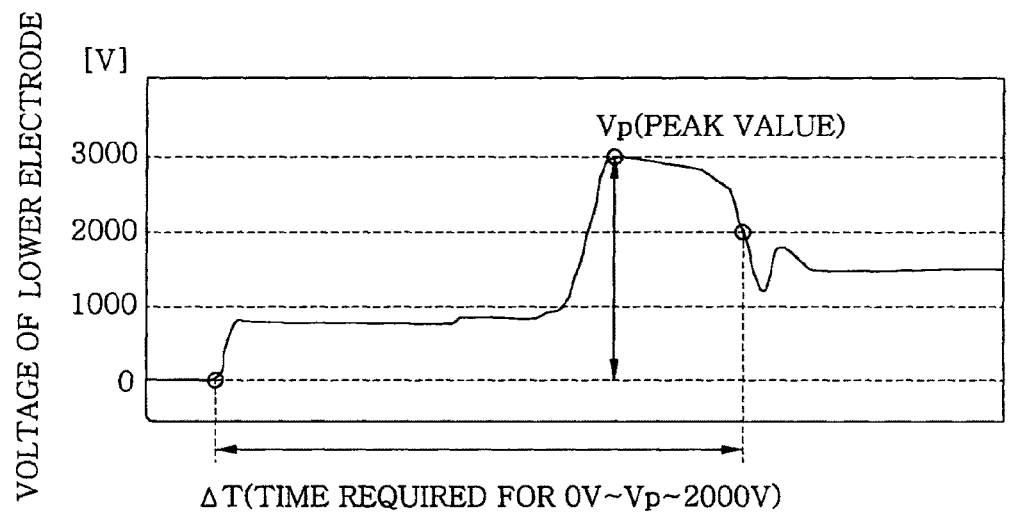
FIG. 7 represents a diagram for explaining a frequency of an abnormal discharge occurrence when a voltage of a susceptor (a lower electrode) is not overshot and that when it is overshot.
FIG. 8 offers a waveform chart of an overshoot voltage applied to the susceptor (a lower electrode)

FIG. 7 depicts a frequency of an abnormal discharge occurrence right after the plasma ignition which was checked in case a voltage of the susceptor 130 is not overshot (see FIG. 3) and in case it is overshot (see FIG. 4) right before the beginning of the plasma processing. In this experiment, for the sake of reliability of an experimental result, there were provided two test plasma processing apparatuses A and B having substantially the same configuration as that of the plasma processing apparatus 100 in accordance with the first embodiment.

In the plasma processing apparatus A, each reactance of matching units for an upper and a lower electrode was adjusted in accordance with the aforementioned [condition 1], i.e., a condition under which a voltage of the lower electrode is not overshot, and then the plasma ignition was repeated several times. As a result, the frequency of an abnormal discharge occurrence was 1.6%. Such result indicates that in case the voltage of the lower electrode is not overshot, the abnormal discharge occurs 1.6 times when the plasma ignition is performed 100 times.

In the plasma processing apparatus A, each reactance of the matching units for an upper and a lower electrode was adjusted in accordance with the aforementioned [condition 2], i.e., a condition under which a voltage of the lower electrode is overshot, and then the plasma ignition was repeated several times. As a result, the frequency of an abnormal discharge occurrence was 0.0%. Such result indicates that in case the voltage of the lower electrode is overshot, the abnormal discharge does not occur regardless of the number of times of the plasma ignition.

The same experiment was performed for the plasma processing apparatus B. As a result, in case [condition 1] was applied, the frequency of the abnormal discharge occurrence was 1.1% while in case [condition 2] was applied, the frequency of the abnormal discharge occurrence was 0.0%.

According to the result of the above experiment using the plasma processing apparatuses A and B, it is possible to prevent the abnormal discharge from occurring right after the plasma ignition in the processing chamber by applying an overshoot voltage to the lower electrode before the plasma processing is started. As described above, the abnormal discharge occurrence right after the plasma ignition has been considered to be caused by the deposits accumulated around the peripheral portion of the lower electrode. By intentionally applying an overshoot voltage to the lower electrode before starting the plasma processing, it is possible to sputter and remove the deposits. When the deposits are removed from the peripheral portion of the lower electrode, the plasma becomes stable right after the plasma ignition. Accordingly, the wafer and the components, e.g., a semiconductor device and the like, formed on the wafer are prevented from being damaged.

Hereinafter, an appropriate size of overshoot (an amount of overshoot) for preventing the abnormal discharge occurrence right after the plasma ignition will be described with reference to FIGS. 8 and 9.

FIG. 8 illustrates an enlarged view of an overshoot portion out of a waveform of a voltage applied to the susceptor 130 serving as the lower electrode shown in FIG. 4. Herein, as illustrated in FIG. 8, the amount of overshoot of the voltage applied to the susceptor 130 is defined by using a peak value Vp of the voltage and a time $\Delta T$ required for stabilizing the voltage which passes the peak value Vp after the voltage is applied to the susceptor 130 (e.g., until the voltage is lowered to 2000 V).

Figure 9:
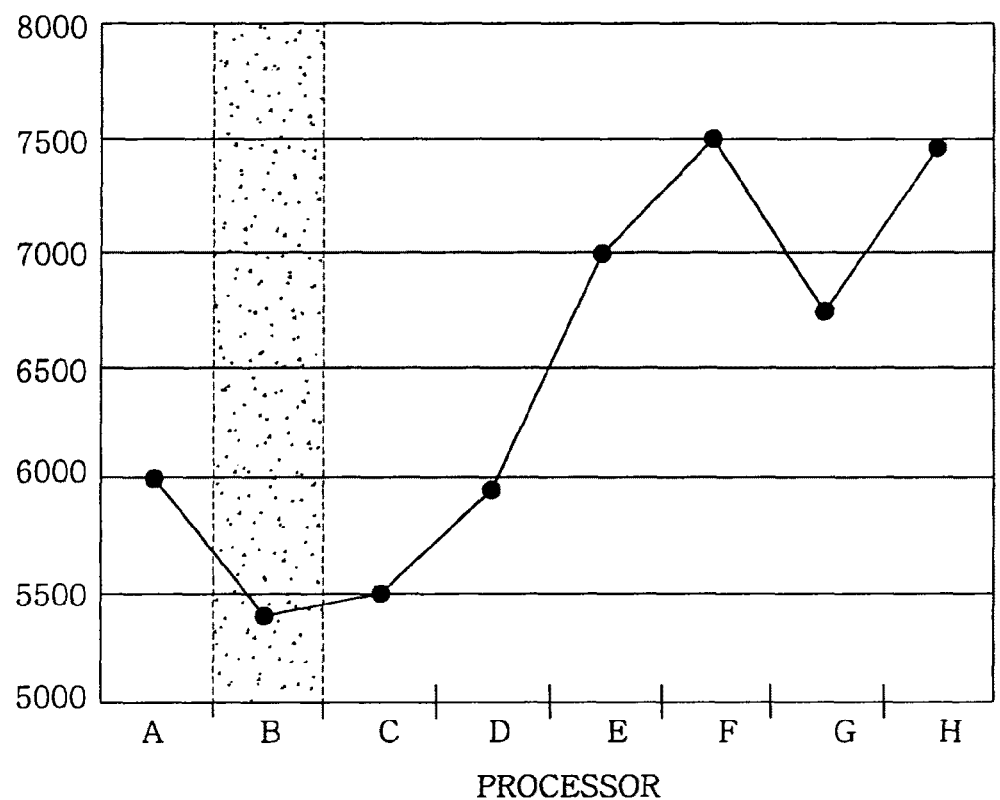
FIG. 9 depicts a graph for demonstrating a relationship between an inhibitory effect on an abnormal discharge and the amount of overshoot.

FIG. 9 depicts a result of an experiment that examined a relationship between the amount of overshoot and an inhibitory effect on the abnormal discharge.

In this experiment, there were provided eight test plasma processing apparatuses A to H having substantially the same configuration as that of the plasma processing apparatus 100 in accordance with the first preferred embodiment. Further, for each of the plasma processing apparatuses, a waveform of a voltage applied to the lower electrode during the plasma ignition was examined and the abnormal discharge occurrence was checked.

Each reactance of the matching units respectively for an upper and a lower electrode which are included in every test plasma processing apparatus was adjusted so as to overshoot the voltage applied to the lower electrode before the plasma processing. However, since a reactance control was modified in each of the plasma processing apparatuses, the amount of overshoot of the voltage applied to the lower electrode became different in each plasma processing apparatus.

As depicted in FIG. 9, in this experiment, the plasma processing apparatus F showed the greatest amount of overshoot and the plasma processing apparatus H showed the second greatest amount of overshoot. On the other hand, the plasma processing apparatus B showed the smallest amount of overshoot, and the plasma processing apparatus C showed the second smallest amount of overshoot. An abnormal discharge was observed right after the plasma ignition only in the plasma processing apparatus B having the smallest amount of overshoot among the eight test plasma processing apparatuses. In other plasma processing apparatuses, an abnormal discharge was not observed.

According to the result of the experiment, in order to prevent the abnormal discharge occurrence right after the plasma ignition, an overshoot voltage needs to be applied to the lower electrode and the amount of the overshoot needs to reach a threshold value. As illustrated in FIG. 9, 5500V·sec can be employed as the threshold value of the amount of overshoot of the voltage applied to the lower electrode. That is, by applying an overshoot voltage greater than 5500V·sec to the lower electrode, it is possible to prevent the abnormal discharge occurrence right after the plasma ignition.

An increase in the amount of overshoot of the voltage applied to the lower electrode is considered to enhance the inhibitory effect on the abnormal discharge occurrence right after the plasma ignition. In order to increase the amount of overshoot, the time $\Delta T$ should be lengthened or the peak value Vp needs to be increased. However, in setting those values, following conditions need to be satisfied.

The main concern in setting the time $\Delta T$ should be put on its effect on a throughput of the plasma processing apparatus. If the time $\Delta T$ is set excessively long, the number of wafers that can be processed per unit time decreases, thereby deteriorating the throughput. On the other hand, the main consideration in setting the peak value Vp should be put on a working voltage (e.g., 3000 V).

In this embodiment, each reactance of the first and the second matching units 143 and 153 is freely adjusted by the control unit 160. Further, the time $\Delta T$ and the peak value Vp of the overshoot voltage applied to the susceptor 130 are determined by thus adjusted reactances of the first and the second matching units 143 and 153. Therefore, in accordance with this embodiment, in order to remove the deposits from the processing chamber 110, it is possible to apply the overshoot voltage whose size does neither deteriorate the throughput of the plasma processing apparatus nor damage the plasma processing apparatus to the susceptor 130 serving as the lower electrode.

As described above, according to the plasma processing apparatus in accordance with the first embodiment and the control method thereof, an overshoot voltage is applied to the susceptor 130 serving as the lower electrode right before the plasma processing is performed on the wafer W. By using the overshoot voltage, the deposits accumulated around the peripheral portion of the susceptor 130 can be removed, thereby preventing the abnormal discharge occurrence right after the plasma ignition in the processing chamber. Further, when the deposits are removed from the peripheral portion of the susceptor 130, uniformity of the plasma density increases, thereby resulting in a stabilization of the plasma processing.

By adjusting each reactance of the first and the second matching units 143 and 153, it is possible to overshoot the voltage applied to the susceptor 130. Since the plasma processing apparatus 100 in accordance with the first preferred embodiment has the control unit 160 capable of adjusting each reactance of the first and the second matching units 143 and 153, it is easy to apply the overshoot voltage to the susceptor 130. Moreover, it is possible to control the amount of overshoot.

Further, since the deposits are removed right before the plasma processing is performed on the wafer W, it is not required to stop the plasma processing apparatus 100 and separate a processing vessel to clean the peripheral portion of the susceptor 130. Therefore, an improvement of the throughput of the plasma processing apparatus 100 can be achieved.

Second Preferred Embodiment

A plasma processing apparatus in accordance with the second preferred embodiment and a control method thereof will be described with reference to FIGS. 1, 10 and 11. The plasma processing apparatus in accordance with the second preferred embodiment has substantially the same configuration as that of the plasma processing apparatus 100 in accordance with the first preferred embodiment. Further, the control method of the plasma processing apparatus in accordance with the second preferred embodiment is equal to that of the plasma processing apparatus in accordance with the first preferred embodiment in that an overshoot voltage is applied to the susceptor 130, or lower electrode, right before the plasma processing is performed on the wafer W.

However, in the plasma processing apparatus in accordance with the second preferred embodiment and the control method thereof, the voltage applied to the susceptor 130 is overshot by different functions and operations from those in case of the plasma processing apparatus 100 in accordance with the first preferred embodiment and the control method thereof.

In other words, in the first preferred embodiment, in order to obtain an overshoot voltage, each reactance of the first and the second matching units 143 and 153 is adjusted by the control unit 160. However, in the second preferred embodiment, an overshoot voltage is generated by adjusting power levels and output timings of the first and the second high frequency power 147 and 157 respectively outputted from the first and the second high frequency power supplies 141 and 151.

Figure 10:
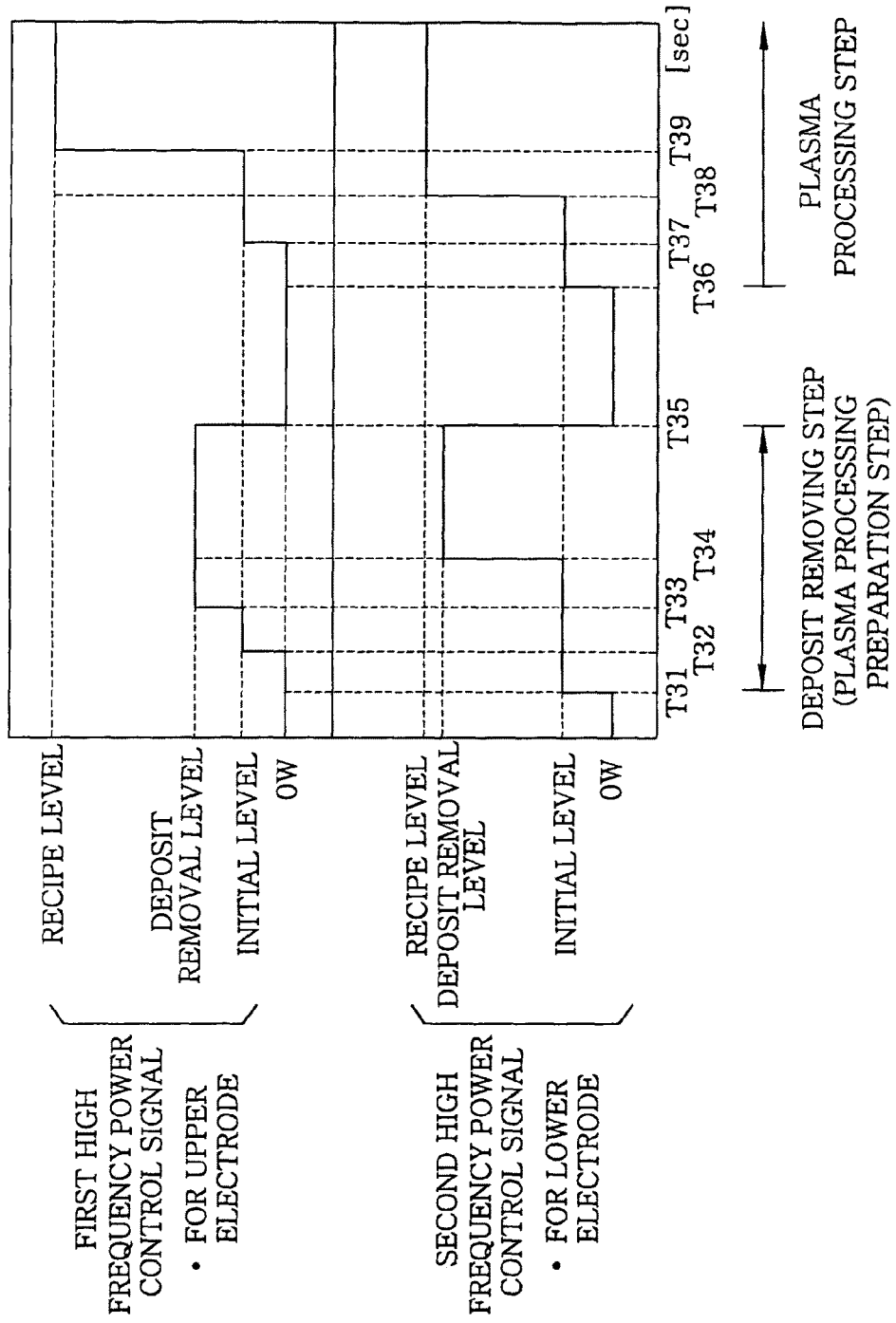
FIG. 10 describes a waveform chart of a control signal outputted from a control unit of a plasma processing apparatus in accordance with a second preferred embodiment of the present invention.

FIG. 10 sets forth a timing chart of control signals outputted from the control unit 160 included in the plasma processing apparatus in accordance with the second preferred embodiment to the first and the second high frequency power supplies 141 and 151. The first high frequency power supply 141 adjusts the output power level and the output timing of the first high frequency power 147 based on the control signal received from the control unit 160. In the same manner, the second high frequency power supply 151 adjusts the output power level and the output timing of the second high frequency power 157 based on the control signal received from the control unit 160.

FIG. 11 illustrates a power waveform of the first high frequency power 147 applied to the upper electrode 120, a power waveform of the second high frequency power 157 applied to the susceptor 130, or lower electrode, and a voltage waveform of the susceptor 130, which are obtained when each control signal is outputted from the control unit 160 to the first and the second high frequency power supplies 147 and 157 at the timings illustrated in FIG. 10.

At a time T31, the control unit 160 transmits a control signal to the second high frequency power supply 151 so that the second high frequency power 157 modulated to an initial level can be outputted (see FIG. 10). The second high frequency power supply 151 that received the control signal outputs the second high frequency power 157 modulated to the initial level (e.g., 200 to 1000 W) to the susceptor 130. Then, a voltage of the susceptor 130, or lower electrode, increases from 0 V to, e.g., 500 V (see FIG. 11).

At a time T32, the control unit 160 transmits a control signal to the first high frequency power supply 141 so that the first high frequency power 147 modulated to an initial level can be outputted (see FIG. 10). The first high frequency power supply 141 that received the control signal outputs the first high frequency power 147 modulated to the initial level (e.g., 50 to 1000 W) to the upper electrode 120. At this time T32, a plasma (preplasma) is ignited between the upper electrode 120 and the susceptor 130. In this case, since the second high frequency power 157 modulated to the initial level was previously applied to the susceptor 130 at the time T31, an ion sheath has already been formed on a surface of the wafer W loaded on the susceptor 130. Therefore, the plasma does not contact the wafer W so that the components, e.g., a semiconductor device and the like, formed on the wafer W can be maintained in a desirable state.

From a time T33 to a time T35, the control unit 160 transmits a control signal to the first high frequency power supply 141 so that the first high frequency power 147 modulated to a deposit removal level which is higher than the initial level can be outputted (see FIG. 10). The first high frequency power supply 141 that received the control signal outputs the first high frequency power 147 modulated to the deposit removal level to the upper electrode 120.

From a time T34 to the time T35, the control unit 160 transmits a control signal to the second high frequency power supply 151 so that the second high frequency power 157 modulated to a deposit removal level can be outputted (see FIG. 10). The second high frequency power supply 151 that received the control signal outputs the second high frequency power 157 modulated to the deposit removal level (e.g., 1000 W) to the susceptor 130. Then, a voltage of the susceptor 130, or lower electrode, increases to, e.g., 2700 V (see FIG. 11).

From the time T35 to a time T36, the first and the second high frequency power supplies 141 and 151 stop outputting of the first and the second high frequency power 147 and 157, respectively, in accordance with a control of the control unit 160. Accordingly, the voltage of the susceptor 130, or lower electrode, decreases to 0 V. At this time, the plasma (preplasma) ignited at the time T32 is also turned off.

At a time T36, the control unit 160 transmits a control signal to the second high frequency power supply 151 so as to output the second high frequency power 157 modulated to the initial level (see FIG. 10). The second high frequency power supply 151 that received the control signal outputs the second high frequency power 157 modulated to the initial level (e.g., 200 to 1000 W) to the susceptor 130. Then, a voltage of the susceptor 130, or lower electrode, increases from 0 V to, e.g., 500 V (see FIG. 11).

At a time T37, the control unit 160 transmits a control signal to the first high frequency power supply 141 so as to output the first high frequency power 147 modulated to the initial level (see FIG. 10). The first high frequency power supply 141 that received the control signal outputs the first high frequency power 147 modulated to the initial level (e.g., 50 to 1000 W) to the upper electrode 120. At this time T37, a plasma (main plasma) is ignited between the upper electrode 120 and the susceptor 130. In this case, since the ion sheath is formed on a surface of the wafer W, the plasma does not make any contact with the wafer W, thereby maintaining the components, e.g., a semiconductor device and the like, formed on the wafer W in a desirable state.

At a time T38, the control unit 160 transmits a control signal to the second high frequency power supply 151 so as to output the second high frequency power 157 modulated to a recipe level (see FIG. 10). The second high frequency power supply 151 that received the control signal outputs the second high frequency power 157 modulated to the recipe level (e.g., 1000 to 2000 W) to the susceptor 130.

At a time T39, the control unit 160 transmits a control signal to the first high frequency power supply 141 so as to output the first high frequency power 147 modulated to a recipe level (see FIG. 10). The first high frequency power supply 141 that received the control signal outputs the first high frequency power 147 modulated the recipe level (e.g., 1000 to 2500 W) to the upper electrode 120 (see FIG. 11). At this time, a voltage of the susceptor 130, or lower electrode, reaches a recipe level (e.g., 1500 V) and then is maintained at the recipe level, thereby enabling a predetermined plasma processing on the wafer W by using the main plasma.

As illustrated in FIGS. 10 and 11, a characteristic of the control method of the plasma processing apparatus in accordance with the second preferred embodiment is that it includes a plasma processing step [since the time T36] for igniting a main plasma and then performing a predetermined plasma processing on the wafer W by using the main plasma; and a deposit removing step [from the time T31 to the time T35] as a plasma processing preparation step for igniting a preplasma to remove deposits inside the processing chamber 110, the deposit removing step being performed prior to the plasma processing step.

The main plasma ignited during the plasma processing step is used for performing a predetermined plasma processing on the wafer W whereas the preplasma ignited during the deposit removing step is used for removing the deposits inside the processing chamber 110. Therefore, physical characteristics of those plasmas are different from each other. Further, as shown in FIGS. 10 and 11, conditions for forming respective plasmas, i.e., power levels of the first and the second high frequency power 147 and 157 and output timings thereof from the first and the second high frequency power supplies 141 and 151 are different from each other.

As illustrated in FIG. 11, for a predetermined period of time during the deposit removing step [from the time T34 to the time T35], a preprocessing voltage (an overshoot voltage) higher than the recipe level is applied to the susceptor 130, or lower electrode, thereby forming the aforementioned preplasma. Thus, even if deposits are accumulated around the peripheral portion of the susceptor 130, the deposits can be completely removed by the preplasma during the deposit removing step.

Furthermore, since the deposit removing step is performed right before the plasma processing step, it is possible to perform a predetermined plasma processing on the wafer W in the processing chamber 110 which is free of the deposits.

As described above, the plasma processing apparatus in accordance with the second preferred embodiment and the control method thereof can provide the same effect as the plasma processing apparatus in accordance with the first preferred embodiment and the control method thereof.

In addition, in the second preferred embodiment, following effects can be obtained. In the second preferred embodiment, the voltage applied to the susceptor 130, or lower electrode, is overshot for a predetermined period of time by adjusting the power levels and the output timings of the first and the second high frequency power 147 and 157 respectively outputted from the first and the second high frequency power supplies 141 and 151. Accordingly, even under processing conditions such as a type of the reaction gas, a pressure in the processing chamber 110, a distance between the upper electrode 120 and the susceptor 130 and the like are changed and the amount of overshoot of the voltage applied to the susceptor 130 can be controlled with relative ease and high accuracy. Therefore, the abnormal discharge occurrence can be more precisely prevented right after the plasma ignition in the processing chamber.

A repetition of the deposit removing step performed prior to the plasma processing step may deteriorate a throughput of the plasma processing apparatus in accordance with the second preferred embodiment. In the second preferred embodiment, it is easy to choose whether or not the deposit removing step is performed prior to the plasma processing step. A high throughput can be obtained by performing the deposit removing step only when there is a need to remove the deposits from the processing chamber 110. The deposit removing step may be performed at predetermined intervals or based on a result obtained by a detector which determines whether or not deposits are accumulated inside the processing chamber 110.

Although a parallel plate plasma processing apparatus is used as an example of the plasma processing apparatus to describe the preferred embodiments, the present invention is not limited thereto. For example, a helicon wave plasma processing apparatus, an inductively coupled plasma processing apparatus and the like can be applied to the present invention.

As described above, in accordance with the present invention, since the overshoot voltage is applied to the second electrode, it is possible to remove the deposits inside the processing chamber, especially, from a peripheral portion of the second electrode. If the overshoot voltage to the second electrode is applied before the beginning of the plasma processing performed on an object to be processed, an abnormal discharge occurrence can be prevented when the plasma processing is started. Further, during the plasma processing, a uniformity of plasma can be obtained. Furthermore, it is possible to implement an improvement of the throughput of the plasma processing apparatus.

While the invention has been shown and described with respect to the preferred embodiments, it will be understood by those skilled in the art that various changes and modifications may be made without departing from the spirit and scope of the invention as defined in the following claims.

The invention claimed is:

1. A control method of a plasma processing apparatus which includes a first electrode arranged in a processing chamber, a second electrode arranged to face the first electrode in the processing chamber, a first power supply for supplying a first power to the first electrode and a second power supply for supplying a second power to the second electrode, comprising:
    applying a preprocessing voltage to the second electrode which holds an object to be processed in the processing chamber and applying the preprocessing voltage for a time period before plasma processing is performed on the object to be processed in the processing chamber, the preprocessing voltage being higher than a voltage applied to the second electrode during the plasma processing of the object.

2. The control method of claim 1, wherein the applying preprocessing voltage comprises:
    adjusting power levels and output timings of the first and the second powers respectively outputted from the first and the second power supplies.

3. The plasma processing apparatus of claim 1, wherein the second electrode is a mounting table of the processing chamber on which the object is mounted.

4. The control method of claim 1, further comprising:
    applying a power level from the second power supply to the second electrode during the time period before the plasma processing, wherein the power level is identical to that during the plasma processing.

5. The control method of claim 1, wherein the product of $V_p$ and $\Delta T$ is greater than 5500V·sec, where $V_p$ is a peak value of the preprocessing voltage and $\Delta T$ is a time required for a voltage applied to the second electrode to increase from 0V to $V_p$ and then to decrease to a threshold voltage.

6. The control method of claim 5, wherein $V_p$ is not greater than 3000V.

7. The control method of claim 5, wherein the threshold voltage is about 2000V.

8. The control method of claim 1, further comprising:
    applying the preprocessing voltage to the second electrode to thereby remove deposits from surrounding regions of the second electrode.

9. The control method of claim 1, wherein the object to be processed is a wafer that has a semiconductor device thereon.

10. The control method of claim 1, wherein the first power is supplied to the first electrode while the preprocessing voltage is applied to the second electrode.

* * * * *